United States Patent [19]

Noguchi

[11] Patent Number: 5,563,837
[45] Date of Patent: Oct. 8, 1996

[54] SEMICONDUCTOR MEMORY DEVICE WITH REDUCED CONSUMPTION POWER AND REFRESHING METHOD OF THE SAME

[75] Inventor: Koji Noguchi, Tokyo, Japan

[73] Assignee: NEC Corporation, Tokyo, Japan

[21] Appl. No.: 295,073

[22] Filed: Aug. 26, 1994

[30] Foreign Application Priority Data

Aug. 27, 1993 [JP] Japan ............................ 5-234316

[51] Int. Cl.⁶ .................................................. G11C 7/00
[52] U.S. Cl. .......................... 365/222; 365/226; 365/227
[58] Field of Search ................................. 365/222, 226, 365/227, 228

[56] References Cited

U.S. PATENT DOCUMENTS

| | | | |
|---|---|---|---|
| 5,323,354 | 6/1994 | Matsumoto et al. | 365/229 |
| 5,337,282 | 8/1994 | Koike | 365/222 |
| 5,367,487 | 11/1994 | Yoshida | 365/222 X |

FOREIGN PATENT DOCUMENTS 0312095  12/1990  Japan ..................................... 365/222

Primary Examiner—David C. Nelms
Assistant Examiner—Huan Hoang
Attorney, Agent, or Firm—Sughrue, Mion, Zinn, Macpeak & Seas

[57] ABSTRACT

A semiconductor memory device having a reduced consumption power at a periodic self-refreshing operation and a refreshing method of this semiconductor memory device, in which a supply voltage to an internal circuit is restricted in a self-refreshing operation period to reduce consumption power. A first internal reference voltage generated by an internal reference voltage generator is dropped in a voltage down circuit to obtain a second internal reference voltage. An internal operation voltage switching circuit switches the first and second internal reference voltages by a timing of a self-refreshing entry signal to output the selected one of these voltages to the internal circuit. The voltage down circuit includes two voltage dividing resistors and an amplifier, and the internal operation voltage switching circuit includes a first and second CMOS bus transistor devices, each composed of two CMOS bus transistors. A restriction voltage is determined within a operation allowable range of the internal circuit.

13 Claims, 5 Drawing Sheets

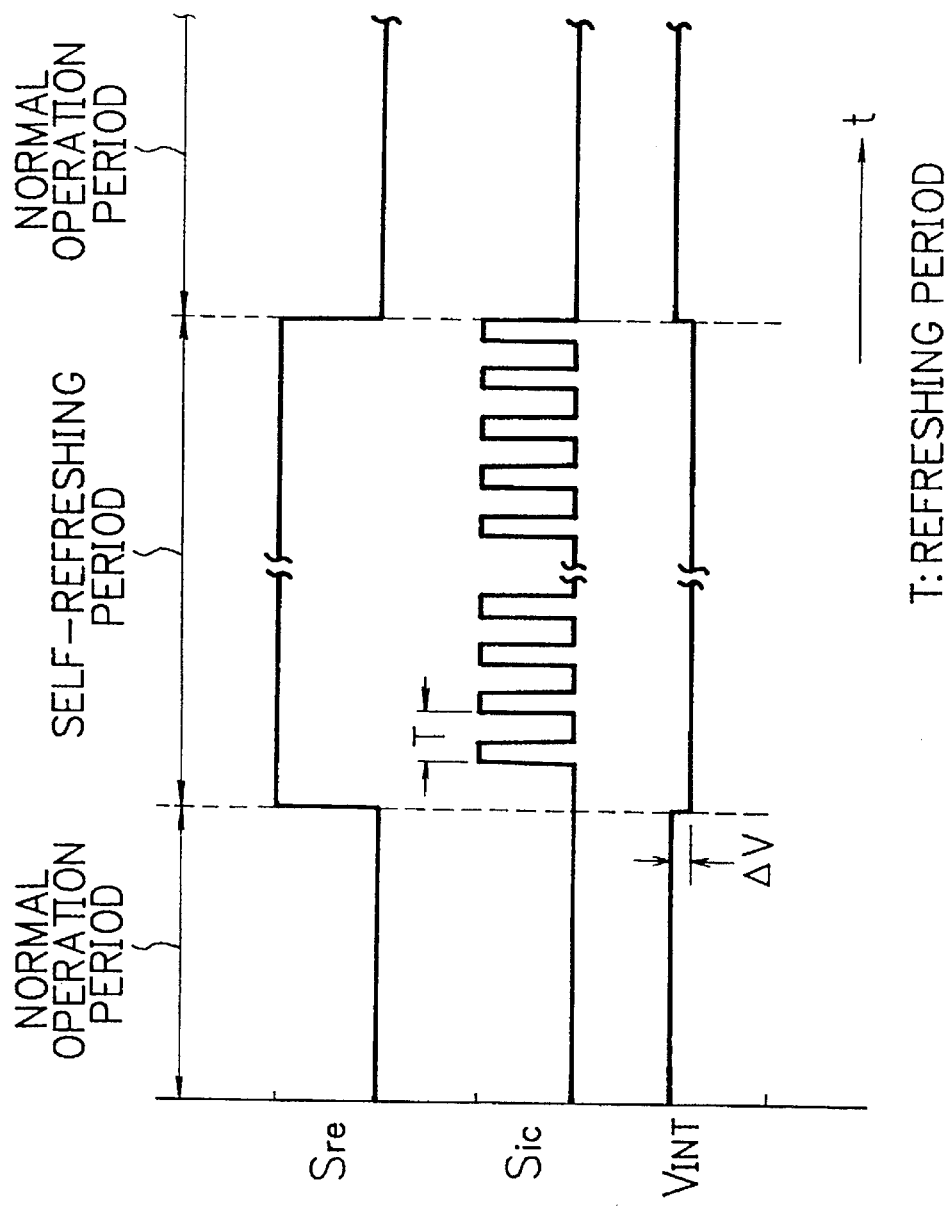

SEMICONDUCTOR MEMORY DEVICE WITH REDUCED CONSUMPTION POWER AND REFRESHING METHOD OF THE SAME

BACKGROUND OF THE INVENTION

The present invention relates to a semiconductor memory device having a reduced consumption power at a periodic self-refreshing operation and a refreshing method of this semiconductor memory device.

DESCRIPTION OF THE RELATED ARTS

In FIG. 1, there is shown a conventional semiconductor memory device having a self-refreshing function. As shown in FIG. 1, the semiconductor memory device of this kind comprises an internal reference voltage generator 1 for generating an internal reference voltage $V_{INT}$, an internal circuit 2 to receive the internal reference voltage $V_{INT}$, a self-refreshing control circuit 3 which inputs a self-refreshing entry signal Sre and outputs a self-refreshing control signal Src to the internal circuit 2 and an internal counter circuit 4 which inputs the self-refreshing entry signal Sre and outputs an internal counter signal Sic to the self-refreshing control circuit 3.

Next, the operation of the conventional semiconductor memory device described above will now be described with reference to FIG. 2.

First, when an external control signal (not shown) is held in a certain state or level for at least a predetermined period, a self-refreshing entry signal Sre as an internal signal for a self-refreshment is input to the self-refreshing control circuit 3 and the internal counter circuit 4 and the internal counter circuit 4 outputs an internal counter signal Sic to the self-refreshing control circuit 3. At the same time, the self-refreshing control circuit 3 outputs a self-refreshing control signal Src to the internal circuit 2 while the internal circuit 2 receives an internal reference voltage $V_{INT}$ from the internal reference voltage generator 1. The internal circuit 2 periodically carries out a refreshing operation at a cycle of the self-refreshing control signal Src.

FIG. 2 shows a normal operational period and a self-refreshing operational period. As shown in FIG. 2, the internal reference voltage $V_{INT}$ does not change and has a fixed value in its level in the normal and self-refreshing operational periods.

In this conventional semiconductor memory device, the internal reference voltage is fixed in the normal and self-refreshing operational periods and in order to reduce consumption power in the self-refreshing operational period, a refreshing period T (the period of the internal counter signal Sic) in the self-refreshing operational period must be lengthened.

However, cells of a dynamic RAM have restriction in their holding property, i.e., a property for holding an information storage charge and accordingly there is a certain limit in the elongation of the refreshing period T. Hence, the consumption power cannot be reduced any more beyond this limit.

SUMMARY OF THE INVENTION

It is therefore an object of the present invention to provide a semiconductor memory device in view of the aforementioned problem of the prior art, which is capable of reducing a consumption power at a periodic self-refreshing operation.

It is another object of the present invention to provide a refreshing method of a semiconductor memory device, which is capable of reducing a consumption power at a periodic self-refreshing operation.

In accordance with one aspect of the present invention, there is provided a semiconductor memory device including self-refreshing means for periodically refreshing contents stored in semiconductor memory elements contained in internal means, comprising internal reference voltage generator means for generating a first predetermined voltage for driving the internal means; voltage down means for generating a second predetermined voltage for driving the internal means: and internal operation voltage switching means for inputting the first and second predetermined voltages and selecting one of these two voltages to output the selected one to the internal means, the internal operation voltage switching means supplying the second predetermined voltage to the internal means in a refreshing operational period and the first predetermined voltage to the internal means in another operational period.

Also, the selecting of one of the first and second predetermined voltages in the internal operation voltage switching means can be executed using a self-refreshing entry signal for controlling the self-refreshing means.

Further, the second predetermined voltage can be obtained by reducing a predetermined rate of voltage from the first predetermined voltage.

Moreover, the internal operation voltage switching means can include first and second gate means, and the first and second predetermined voltages can be supplied to the first and second gate means, respectively, and an open-close control of the first and second gate means can alternately be executed.

In accordance with another aspect of the present invention, there is provided a refreshing method of a semiconductor memory device having a self-refreshing function for periodically refreshing contents stored in semiconductor memory elements contained in an internal means, comprising an internal reference voltage generating step for generating a first predetermined voltage for driving the internal means; a voltage down step for generating a second predetermined voltage for driving the internal means: and an internal operation voltage switching step for inputting the first and second predetermined voltages and selecting one of these two voltages to output the selected one to the internal means, in which the second predetermined voltage is supplied to the internal means in a refreshing operational period and the first predetermined voltage is supplied to the internal means in another operational period in the internal operation voltage switching step.

Also, the selecting of one of the first and second predetermined voltages in the internal operation voltage switching step can be executed using a self-refreshing entry signal for controlling the self-refreshing function.

Further, the second predetermined voltage can be obtained by reducing a predetermined rate of voltage from the first predetermined voltage.

Moreover, the internal operation voltage switching step can include first and second gate means, and the first and second predetermined voltages can be supplied to the first and second gate means, respectively, and an open-close control of the first and second gate means can alternately be executed.

Hence, according to the present invention, in the semiconductor memory device and a refreshing method, an essential section generates a first predetermined voltage or a second predetermined voltage for driving the internal circuit and switches the two voltages to output either one of the first and second predetermined voltages to the internal circuit. That is, in the refreshing operation, the second predetermined voltage is output to the internal circuit and in other operations except the refreshing operation, the first predetermined voltage is output to the internal circuit.

Hence, the second predetermined voltage used in the refreshing operation can be set lower than the first predetermined voltage in other operations.

BRIEF DESCRIPTION OF THE DRAWINGS

The objects, features and advantages of the present invention will become more apparent from the consideration of the following detailed description, taken in conjunction with the accompanying drawings, in which:

FIG. 5 is a timing chart showing an operation of the semiconductor memory device shown in FIG. 3.

DESCRIPTION OF THE PREFERRED EMBODIMENTS

Figure 1:
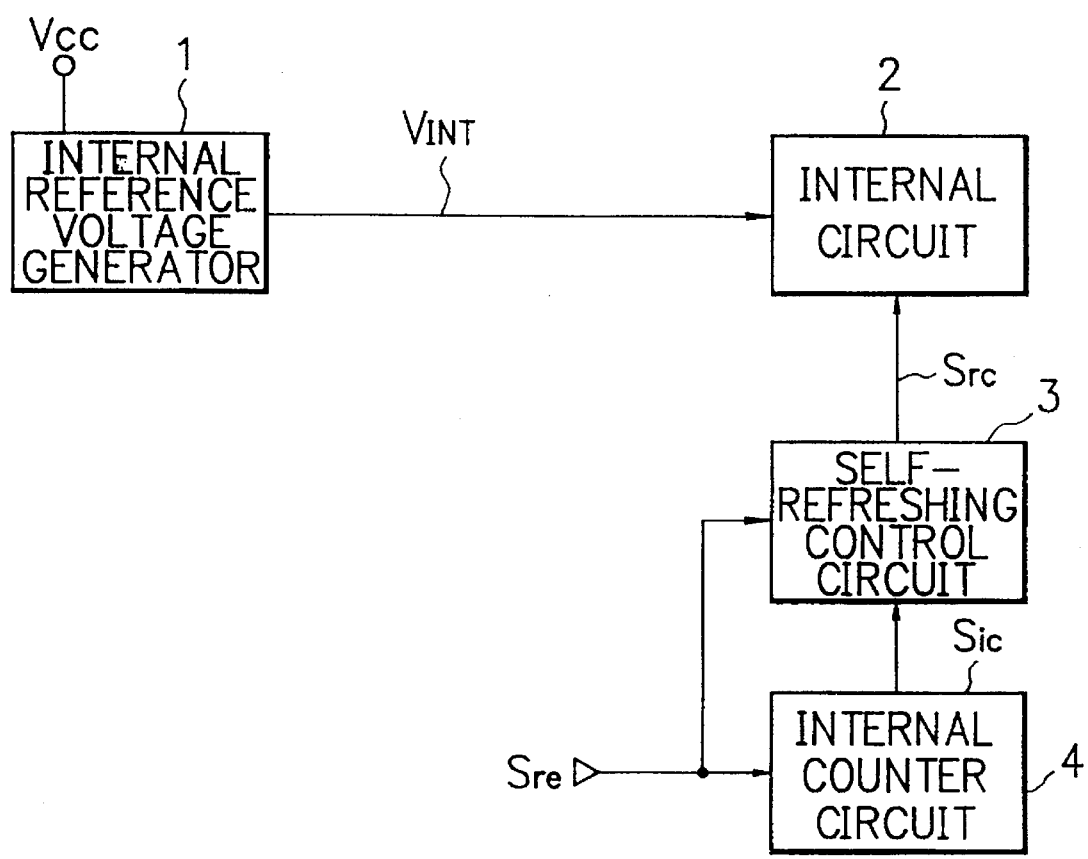
FIG. 1 is a block diagram of a conventional semiconductor memory device having a self-refreshing function.
Figure 2:
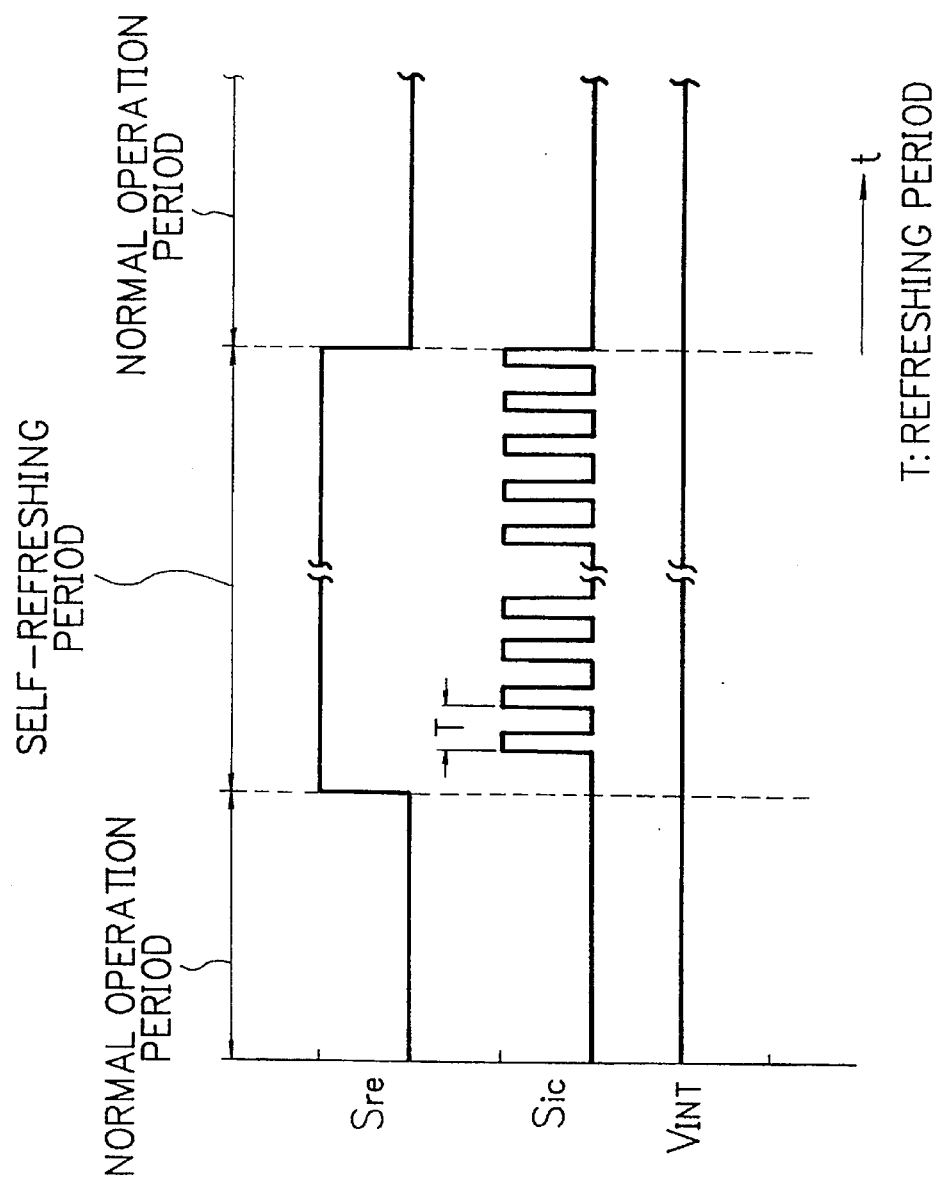
FIG. 2 is a timing chart showing an operation of the conventional semiconductor memory device shown in FIG. 1.
Figure 3:
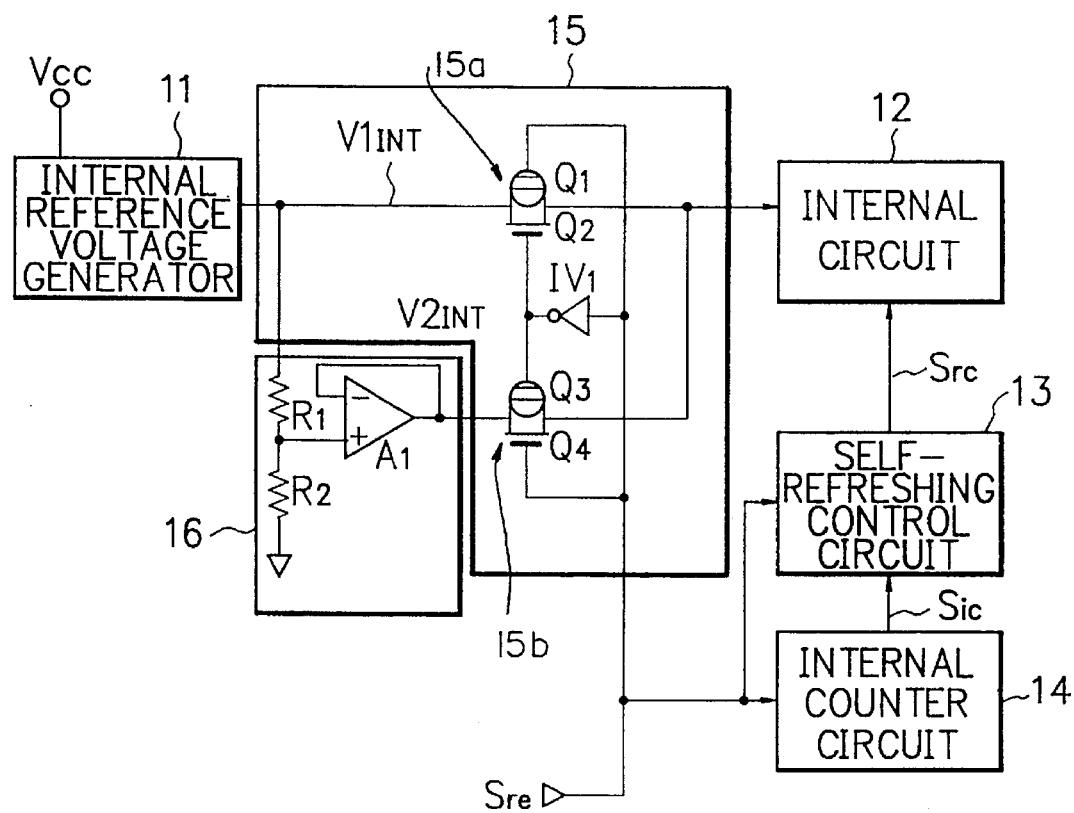
FIG. 3 is a block diagram of a semiconductor memory device having a self-refreshing function according to the present invention.

Referring now to the drawings, wherein like reference characters designate like or corresponding parts throughout the views and thus the repeated description thereof can be omitted for brevity, there is shown in FIG. 3 one embodiment of a semiconductor memory device having a self-refreshing function according to the present invention.

As shown in FIG. 3, the semiconductor memory device comprises an internal reference voltage generator 11 for generating a first internal reference voltage $V1_{INT}$, an internal circuit 12, a self-refreshing control circuit 13 which inputs a self-refreshing entry signal Sre and outputs a self-refreshing control signal Src to the internal circuit 12, an internal counter circuit 14 which inputs the self-refreshing entry signal Sre and outputs an internal counter signal Sic to the self-refreshing control circuit 13, an internal operation voltage switching circuit 15 and a voltage down circuit 16.

More specifically, the internal reference voltage generator 11 as a constant-voltage generator inputs an external electric power voltage $V_{cc}$ and generates the first internal reference voltage $V1_{INT}$. The generated first internal reference voltage $V1_{INT}$ is input to the internal operation voltage switching circuit 15. In this embodiment, in order to reduce a consumption power, the first internal reference voltage $V1_{INT}$, obtained by reducing a certain voltage from the power voltage $V_{cc}$, is used.

Figure 4:
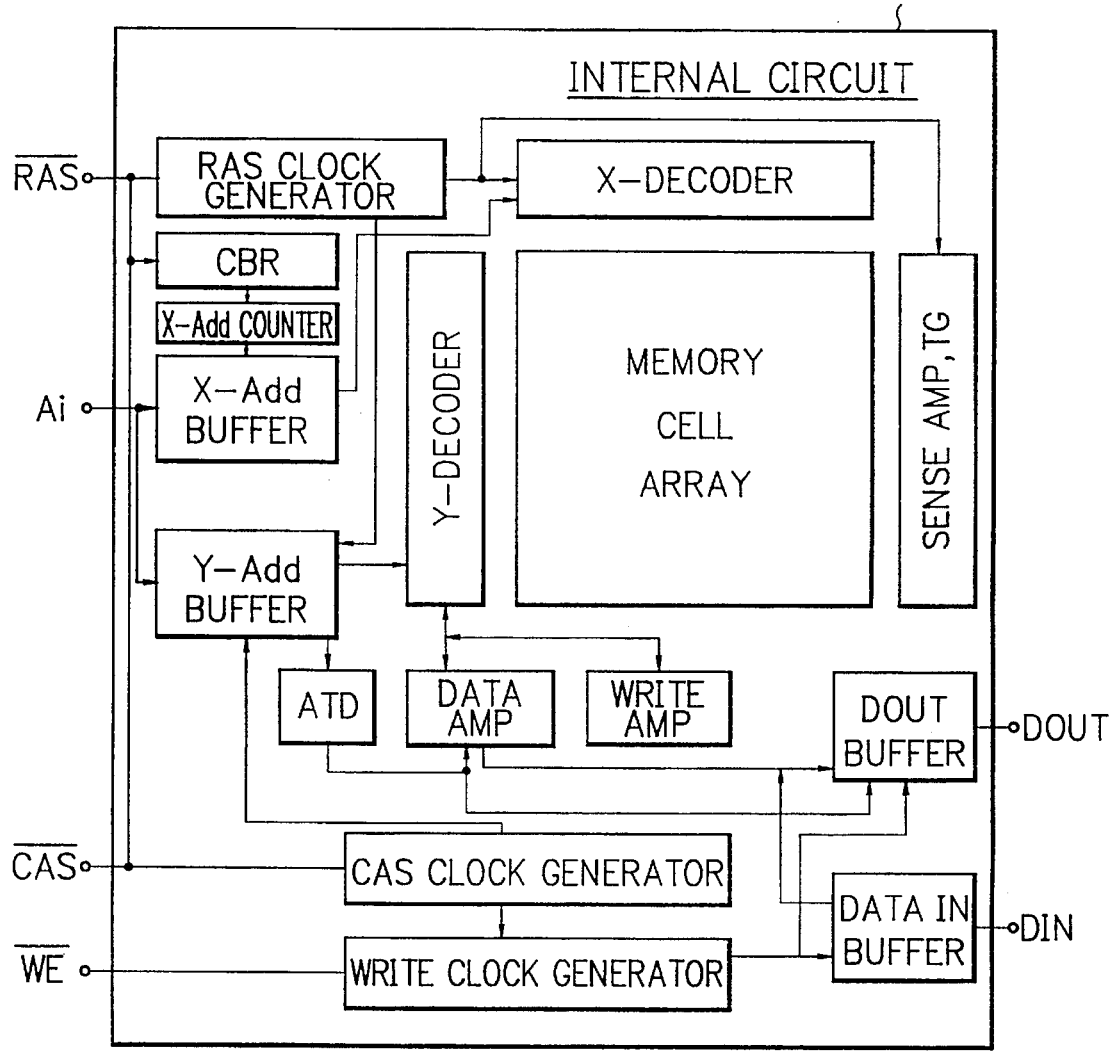
FIG. 4 is a block diagram of an internal circuit shown in FIG. 3.

The internal circuit 12 is a circuit part composed of a refreshing type of semiconductor elements. In this embodiment, the internal circuit 12 inputs its power voltage from the internal operation voltage switching circuit 15 and also the self-refreshing control signal Src for controlling the refreshing operation of the semiconductor memory elements from the self-refreshing control circuit 18. A detailed construction of the internal circuit 12 is shown in FIG. 4. As shown in FIG. 4, the internal circuit 12 may have a DRAM (dynamic random access memory) structure, in which memory cells such as semiconductor memory elements as a memory cell array input data via an input terminal DIN, store the input data therein and output the stored data as output data via an output terminal DOUT.

The self-refreshing control circuit 13 is a circuit part for carrying out a refreshing control of the internal circuit 12 at a predetermined period. The self-refreshing control circuit 18 inputs the self-refreshing entry signal Sre and the internal counter signal Sic output from the internal counter circuit 14 and outputs the self-refreshing control signal Src to the internal circuit 12. An example of a timing of this refreshing operation along with a normal operation is shown in FIG. 5, hereinafter described in detail.

The internal counter circuit 14 is a circuit part to generate and output a signal having a refreshing period T. The internal counter circuit 14 inputs the self-refreshing entry signal Sre and outputs the internal counter signal Sic to the self-refreshing control circuit 18.

The internal operation voltage switching circuit 15 is a circuit part which inputs two voltages having different voltage levels, that is, the first internal reference voltage $V1_{INT}$ and a second internal reference voltage $V2_{INT}$ form the internal reference voltage generator 11 and a voltage down circuit 16 hereinafter described, respectively, and switches the two voltages so as to output one of the two voltages. The internal operation voltage switching circuit 15 includes first and second CMOS bus transistor devices 15a and 15b. The first CMOS bus transistor device 15a is composed of two CMOS bus transistors, i.e., a P-channel transistor Q1 and an N-channel transistor Q2 coupled with each other and the second CMOS bus transistor device 15b is composed of two CMOS bus transistors, i.e., a P-channel transistor Q3 and an N-channel transistor Q4 coupled with each other. In each first or second CMOS bus transistor device 15a or 15b, the sources of the two transistors Q1 and Q2 or Q3 and Q4 are coupled and the drains of the same are also coupled to prepare two gate circuits. In the connection of the gate electrodes for controlling the two gate circuits, the gates of the two transistors Q1 and Q4 are coupled and the gates of the two transistors Q2 and Q3 are coupled. Between the coupled two gates, an inverter IV1 is connected.

In the internal operation voltage switching circuit 15 as constructed above, the first internal reference voltage $V1_{INT}$ is supplied to the input terminal of the first CMOS bus transistor device 15a and the second internal reference voltage $V2_{INT}$ is to the input terminal of the second CMOS bus transistor device 15b. The output terminals of the first and second CMOS bus transistor devices 15a and 15b are coupled, and act as an output terminal to be connected to the internal circuit 12. The coupled gate electrodes of the internal operation voltage switching circuit 15 are connected to the input terminals of the self-refreshing control circuit 13 and the internal counter circuit 14 so as to receive the self-refreshing entry signal Sre.

In this case, when the self-refreshing entry signal Sre is low in its level, the second CMOS bus transistor device 15b closes its gate and the first CMOS bus transistor device 15a opens its gate to pass the first internal reference voltage $V1_{INT}$ to the internal circuit 12. On the other hand, when the self-refreshing entry signal Sre is high in its level, the first CMOS bus transistor device 15a closes its gate and the second CMOS bus transistor device 15b opens its gate to pass the second internal reference voltage $V2_{INT}$ to the internal circuit 12.

The voltage down circuit 16 is composed of first and second resistors R1 and R2 connected in series to produce a partial resistance and an amplifier A1. The connection of the two resistors R1 and R2 is coupled with a +input terminal of an amplifier A1 a − input terminal and an output terminal of the amplifier A1 are coupled to make the amplifier A1 be an impedance converter circuit. In the voltage down circuit 16, the other end of the first resistor R1 is connected to the output terminal of the internal reference voltage generator 11 and the other end of the second resistor R2 is to ground (GND). The output terminal of the amplifier A1 is coupled with the input terminal of the second CMOS bus transistor device 15b. In the voltage down circuit 16, the input first internal reference voltage $V1_{INT}$ is reduced by a displacement voltage $\Delta V$ to obtain the second internal reference voltage $V2_{INT}=V1_{INT}-\Delta V$ to be fed to the second CMOS bus transistor device 15b in the internal operation voltage switching circuit 15. In this embodiment, a drop voltage ratio $\Delta V/V1_{INT}$ is approximately 10%.

In the internal operation voltage switching circuit 15, the first and second internal reference voltage $V1_{INT}$ and $V2_{INT}$ are supplied to the respective first and second CMOS bus transistor devices 15a and 15b and one of the first and second internal reference voltages $V1_{INT}$ and $V2_{INT}$ is selected by the level of the self-refreshing entry signal Sre. That is, as described above, in the normal operation mode, the self-refreshing entry signal Sre is inactive or low in its level and the internal operation voltage switching circuit 15 outputs the first internal reference voltage $V1_{INT}$. And the internal circuit 12 operates by the first internal reference voltage $V1_{INT}$. On the other hand, in the self-refreshing operation mode, the self-refreshing entry signal Sre is active or high in its level and the internal operation voltage switching circuit 15 outputs the second internal reference voltage $V2_{INT}$. Hence, the internal circuit 12 operates by the second internal reference voltage $V2_{INT}$.

At the same time, the operation moves to the self-refreshing operation, that is, the internal circuit 12 periodically executes the self-refreshing operation of the semiconductor memory device at the refreshing period T (the period of the internal counter signal Sic) by the self-refreshing control signal Src output from the self-refreshing control circuit 13 under the control of the self-refreshing entry signal Sre.

In this embodiment, as shown in FIG. 5, the self-refreshing entry signal Sre is inactive during the normal operation and no internal counter signal Sic is output from the internal counter circuit 14. Hence, the internal circuit 12 operates at the first internal reference voltage $V1_{INT}$.

Next, when entering in the self-refreshing mode, the self-refreshing entry signal Sre turns to be active and the internal counter circuit 14 outputs the internal counter signal Sic to the self-refreshing control circuit 13. Thus, as described above, the operational voltage of the internal circuit 12 is switched to the second internal reference voltage $V2_{INT}$ and the consumption power in the self-refreshing mode reduces.

In the semiconductor memory device of this embodiment, assuming that the internal operation voltage in the self-refreshing operation is dropped by, for example, 10% with respect to that in the normal operation, approximately 20% can be reduced in consumption power in comparison with the case where the same internal operation voltage as that in the normal operation is used in the self-refreshing operation.

In this embodiment, against the transition of the internal operation voltage due to the displacement voltage $\Delta V$, it is conceivable that a writing level drop in the refreshing somewhat occurs. However, it is confirmed by an experiment that no problem arises in the operation by taking a large operational margin of the internal circuit 12 and setting a drop voltage within an operational allowable range of the internal circuit 12.

In this case, although one example of the internal operation voltage switching circuit 15 and the voltage down circuit 16 is shown in FIG. 3, of course, other circuits having similar or same functions to or as those of the circuits can be included in the present invention.

Although the present invention has been described in its preferred embodiments with reference to the accompanying drawings, it is readily understood that the present invention is not restricted to the preferred embodiments and that various changes and modifications can be made by those skilled in the art without departing from the spirit and scope of the present invention.

As apparent from the above description, in the semiconductor memory device and a refreshing method, an essential section generates a first predetermined voltage or a second predetermined voltage for driving the internal circuit and switches the two voltages to output either one of the first and second predetermined voltages to the internal circuit. That is, in the refreshing operation, the second predetermined voltage is output to the internal circuit and in other operations except the refreshing operation, the first predetermined voltage is output to the internal circuit. Hence, the second predetermined voltage used in the refreshing operation can be determined lower than the first predetermined voltage in other operations. The second predetermined voltage is determined by reducing a predetermined voltage $\Delta V$ within an operable range of the internal circuit with respect to the first predetermined voltage, with the result of reducing the consumption power of the semiconductor memory device.

What is claimed is:

1. A semiconductor memory device having a normal operation mode and a self-refreshing operation mode, said device comprising:

an internal circuit which includes a memory cell array and operates at an internal operation voltage;

self-refreshing means for periodically refreshing contents stored in said memory cell array;

internal reference voltage generator means for supplying a first predetermined voltage;

voltage down means for supplying a second predetermined voltage; and internal operation voltage switching means for setting said internal operation voltage by selectively supplying said first and said second predetermined voltage to said internal circuit;

wherein said internal operation voltage switching means provides said first predetermined voltage to said internal circuit during said normal operation mode, and provides said second predetermined voltage to said internal circuit, during said self-refreshing mode; and wherein said internal operation voltage of said internal circuit, is lower in amplitude during said self-refreshing mode than during said normal mode.

2. The semiconductor memory device as claimed in claim 1, wherein the selecting of one of the first and second predetermined voltages in the internal operation voltage switching means is executed using a self-refreshing entry signal for controlling the self-refreshing means.

3. The semiconductor memory device as claimed in claim 1, wherein the second predetermined voltage is obtained by reducing a predetermined rate of voltage from the first predetermined voltage.

4. The semiconductor memory device as claimed in claim 1, wherein the internal operation voltage switching means includes first and second gate means and the first and second predetermined voltages are supplied to the first and second gate means, respectively, and wherein an open-close control of the first and second gate means is alternately executed.

5. A refreshing method of a semiconductor memory device having a self-refreshing function for periodically refreshing contents stored in semiconductor memory elements contained in an internal means, comprising:

an internal reference voltage generating step for generating a first predetermined voltage for driving the internal means;

a voltage down step for generating a second predetermined voltage for driving the internal means, wherein said second predetermined voltage has a lower amplitude than said first predetermined voltage; and an internal operation voltage switching step for inputting the first and second predetermined voltages and selecting one of these two voltages to output the selected one to the internal means, the second predetermined voltage being supplied to the internal means in a refreshing operational period and the first predetermined voltage being supplied to the internal means in another operational period in the internal operation voltage switching step;

said internal means having an internal operation voltage which has a lower amplitude during said refreshing operational period than during said another operational period.

6. The refreshing method as claimed in claim 5, wherein the selecting of one of the first and second predetermined voltages in the internal operation voltage switching step is executed using a self-refreshing entry signal for controlling the self-refreshing function.

7. The refreshing method as claimed in claim 5, wherein the second predetermined voltage is obtained by reducing a predetermined rate of voltage from the first predetermined voltage.

8. The refreshing method as claimed in claim 5, wherein the internal operation voltage switching step includes first and second gate means and the first and second predetermined voltages are supplied to the first and second gate means, respectively, and wherein an open-close control of the first and second gate means is alternately executed.

9. A semiconductor memory device having a self-refreshing operation mode and a normal operation mode, comprising:

a semiconductor memory cell array driven at an internal operation voltage, wherein said internal operation voltage has a lower amplitude during said self-refreshing operation mode than during said normal operation mode;

an internal operation voltage switching circuit supplying a first predetermined voltage during said normal operation mode and a second predetermined voltage during said self-refreshing operation mode; and an internal circuit which includes said semiconductor memory cell array, and which has a DRAM structure;

wherein said internal operation voltage driving said semiconductor memory cell array also drives said internal circuit, and said internal operation voltage is provided by said internal operation voltage switching circuit as one of said first and said second predetermined voltage.

10. The semiconductor memory device as set forth in claim 9, further comprising:

internal reference voltage generator means for providing said first predetermined voltage to said internal operation voltage switching circuit; and voltage down means for providing said second predetermined voltage to said internal operation voltage switching circuit;

wherein said internal reference voltage generator also provides said first predetermined voltage to said voltage down means, which reduces therefrom a predetermined rate of voltage to provide said second predetermined voltage.

11. The semiconductor memory device as set forth in claim 10, further comprising:

internal counter means; and self-refreshing control means;

wherein said internal counter means provides an internal counter signal to said self-refreshing control means in response to a self-refresh entry signal;

wherein said self-refreshing control means provides a self-refreshing control signal to said internal circuit in response to said self-refresh entry signal and said internal counter signal;

wherein said internal operation voltage switching circuit provides said first and said second predetermined voltage in response to said self-refresh entry signal; and wherein said self-refresh entry signal determines whether said semiconductor memory device operates in said normal operation mode or said self-refreshing operation mode.

12. The semiconductor memory device as set forth in claim 11, wherein said voltage down means comprises:

a first and a second resistor, each having a first and a second end; and an amplifier having a negative input terminal, a positive input terminal, and an output terminal;

said first end of said first resistor being an input terminal of said voltage down means, and receiving said first predetermined voltage from said internal reference voltage generator means;

said second end of said first resistor, said positive input terminal of said amplifier, and said first end of said second resistor being connected;

said second end of said second resistor being at ground potential; and said negative input terminal of said amplifier being connected to said output terminal of said amplifier, which is an output terminal of said voltage down means, and supplies said second predetermined voltage to said internal operation voltage switching circuit.

13. The semiconductor memory device as set forth in claim 12, wherein said internal operation voltage switching circuit comprises:

a first and a second CMOS bus transistor device, each of which has a respective input and output terminal, and comprises a respective P-channel transistor which is source-coupled and drain-coupled to a respective N-channel transistor; and an inverter;

a gate of said respective P-channel transistor of said first CMOS bus transistor device being connected to a gate of said respective N-channel transistor of said second CMOS bus transistor device, to a first end of said inverter, and to a terminal for receiving said self-refreshing entry signal;

a gate of said respective N-channel transistor of said first CMOS bus transistor device being connected to a gate of said respective P-channel transistor of said second CMOS bus transistor device, and to a second end of said inverter;

said input terminal of said first CMOS bus transistor device receiving said first predetermined voltage from said internal reference voltage generator means, and said input terminal of said second CMOS bus transistor device receiving said second predetermined voltage from said voltage down means;

said output terminal of said first and said second CMOS bus transistor device being connected in common to provide an output terminal of said internal operation voltage switching circuit for supplying said first and said second predetermined voltage.

* * * * *